US007234214B2

(12) United States Patent
Xu et al.

(10) Patent No.: US 7,234,214 B2
(45) Date of Patent: *Jun. 26, 2007

(54) METHODS FOR MAKING THICK FILM ELEMENTS

(75) Inventors: Baomin Xu, Cupertino, CA (US); Steven A. Buhler, Sunnyvale, CA (US); Michael C. Weisberg, Woodside, CA (US); William S. Wong, San Carlos, CA (US); Scott E. Solberg, Mountain View, CA (US); Karl A. Littau, Palo Alto, CA (US); John S. Fitch, Los Altos, CA (US); Scott A. Elrod, La Honda, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 102 days.

This patent is subject to a terminal disclaimer.

(21) Appl. No.: 11/084,579

(22) Filed: Mar. 18, 2005

(65) Prior Publication Data

US 2005/0162045 A1    Jul. 28, 2005

Related U.S. Application Data

(62) Division of application No. 10/376,544, filed on Feb. 25, 2003, now Pat. No. 7,089,635.

(51) Int. Cl.
*H04R 17/00* (2006.01)
(52) U.S. Cl. ............... 29/25.35; 29/25.42; 29/832; 29/834; 310/332; 310/358; 156/230
(58) Field of Classification Search .... 29/25.35–25.42, 29/830–834, 842, 846; 310/328–332, 366, 310/358; 156/152, 247, 230; 438/455, 458, 438/107, 604; 428/202, 209
See application file for complete search history.

(56) References Cited

U.S. PATENT DOCUMENTS 4,233,477 A    11/1980    Rice et al.

(Continued)

FOREIGN PATENT DOCUMENTS

| JP | 63150979 A | 6/1988 |
|---|---|---|
| JP | 02005325 A | 1/1990 |
| JP | 04023370 A | 1/1990 |
| JP | 02162782 A | 6/1990 |
| WO | WO 99/48621 A | 9/1999 |
| WO | WO 01/39253 A | 5/2001 |

OTHER PUBLICATIONS

Tsakalakos, L. et al., *Epitaxial Ferroelectric (Pb, La)(Zr Ti)O$_3$ Thin Films on Stainless Steel by Excimer Laser Liftoff*, Applied Physics Letters, Jan. 10, 2000, vol. 76, No. 2, pp. 227-229.

(Continued)

*Primary Examiner*—Minh Trinh
(74) *Attorney, Agent, or Firm*—Fay Sharpe LLP

(57) ABSTRACT

A method of producing at least one thick film element, including depositing a material on a surface of at least one first substrate to form at least one thick film element structure having a thickness of approximately greater than 10 μm to 100 μm. Then, then the at least one thick film element structure is bonded to a second substrate, and the at least one first substrate is removed from the at least one thick film element structure using a lift-off process employing radiation energy. The lift-off process including emitting, from a radiation source, a radiation beam through the first substrate to an attachment interface formed between the first substrate and the at least one thick film element structure at the first surface of the first substrate. The first substrate being substantially transparent at the wavelength of the radiation beam, permitting the radiation beam to generate sufficient energy at the interface to break the attachment.

21 Claims, 17 Drawing Sheets

U.S. PATENT DOCUMENTS

| | | | |
|---|---|---|---|
| 4,649,312 | A | 3/1987 | Robin et al. |
| 5,034,649 | A | 7/1991 | Chida et al. |
| 5,083,056 | A | 1/1992 | Kondou et al. |
| 5,248,912 | A | 9/1993 | Zdeblick et al. |
| 5,268,611 | A | 12/1993 | Culp |
| 5,486,494 | A | 1/1996 | Hotchkiss et al. |
| 5,585,136 | A | 12/1996 | Barrow et al. |
| 5,869,189 | A | 2/1999 | Hagood, IV et al. |
| 5,950,291 | A | 9/1999 | Gentilman et al. |
| 6,071,795 | A | 6/2000 | Cheung et al. |
| 6,138,348 | A | 10/2000 | Kulesza et al. |
| 6,262,516 | B1 | 7/2001 | Fukuda et al. |
| 6,270,202 | B1 | 8/2001 | Namba et al. |
| 6,335,263 | B1 | 1/2002 | Cheung et al. |
| 6,367,132 | B2 | 4/2002 | Chatterjee et al. |
| 6,370,964 | B1 | 4/2002 | Chang et al. |
| 6,408,513 | B1 | 6/2002 | Kitahara et al. |
| 6,645,830 | B2 | 11/2003 | Shimoda et al. |
| 6,666,943 | B2 | 12/2003 | Wada et al. |
| 6,771,007 | B2 | 8/2004 | Tanielian |
| 2002/0036055 | A1 | 3/2002 | Yoshimura et al. |
| 2002/0149296 | A1 | 10/2002 | Fujii et al. |

OTHER PUBLICATIONS

Tsakalakos, L. et al., *Excimer Laser Liftoff of Epitaxial Pb(Zr, Ti)O$_3$ Thin Films and Heterostructures*; Mat. Res. Soc. Symp. Proc., vol. 596, 2000 Materials Research Society, pp. 549-557; Ferroelectric Thin Films VIII, Nov. 29-Dec. 2, 1999.

Lukacs, M. et al., *Novel PZT Films for Ultrasound Biomicroscopy*; 1996 IEEE Ultrasonics Symposium, pp. 901-904.

Barrow, et al., *Characterization of Thick Lead Zirconate Titanate Films Fabricated Using a New Sol Gel Based Process*; J. Appl. Phys. 81 (2), Jan. 15, 1997, 1997 American Institute of Physics, pp. 876-881.

Wong, W.S., et al., *Integration of GaN Thin Films with Dissimilar Substrate Materials by Pd-In Metal Bonding and Laser Lift-Off*; Journal of Electronic Materials, vol. 28, No. 12, 1999, pp. 1409-1413.

Chen, Yi-Chia, et al., *A Fluxless Bonding Technology Using Indium-Silver Multilayer Composites*; IEEE Transactions on Components, Packaging, and Manufacturing Technology—Part A., vol. 20, No. 1, Mar. 1997, pp. 46-51.

Lee, Chin C., et al., *Au-In Bonding Below the Eutectic Temperature*; IEEE Transactions on Components, Hybrids, and Manufacturing Technology, vol. 16, No. 3, May 1998, pp. 311-316.

Chen, Yi-Chia, *Indium-Copper Multilayer Composites for Fluxless Oxidation-Free Bonding*; Thin Solid Films 283 (1996), pp. 243-246; 1996 Elsevier Science S.A.

Mathelin, D., et al., *Improved Microcontact Technology*, The Compete Network presents Immico, (BE-8225), Up-dated: Spring 1998, pp. 1-9.

Sayer, M., et al., *Macroscopic Actuators Using Thick Piezoelectric Coatings*; Mat. Res. Soc. Symp. Proc., vol. 655, 2001 Materials Research Society; pp. CC13.6.1-CC13.6.11.

Lin, Mark, et al., *The Manufacture of Composite Structures with a Built-in Network of Piezoceramics*; Composites Science and Technology, 62 (2002), pp. 919-939.

Zou, L. et al., *Sol-Gel Fabricated Think Piezoelectric Ultrasonic Transducers for Potential Applications in Industrial Material Processes*; 1997 IEEE Ultrasonics Symposium, pp. 1007-1011.

Qi, Wenkang et al., "Finite Element Study on Random Design of 2-2 Composite Transducer", Proceedings of SPIE—The International Society for Optical Engineering 1997 Society of Photo-Optical Instrumentation Engineers, Bellingham, WA, US, vol. 3037, 1997, pp. 176-180.

Sundaresan, M.J. et al., "Methods of Distributed Sensing for Health Monitoring of Composite Material Structures", Composites Part A: Applied Science and Manufacturing, Elsevier Science Publishers B.V., Amsterdam, NL, vol. 32, No. 9, Sep. 2001, pp. 1357-1374.

European Search Report, Feb. 15, 2006, Application No. EP 04 004266, Examiner D. Meacher.

Tressler, J.F. et al., "Functional Composites for Sendors, Actuators and Transducers", Composites Part A: Applied Science and Manufacturing, Elsevier Science Publishers B.V., Amsterdam, NL, vol. 30, No. 4, Apr. 1999 pp. 477-482.

FIG. 7A
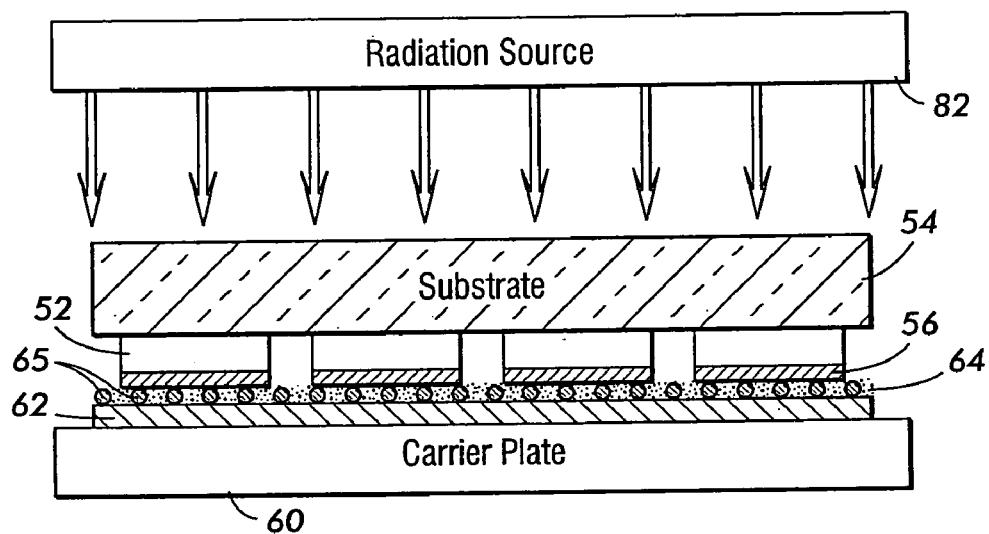
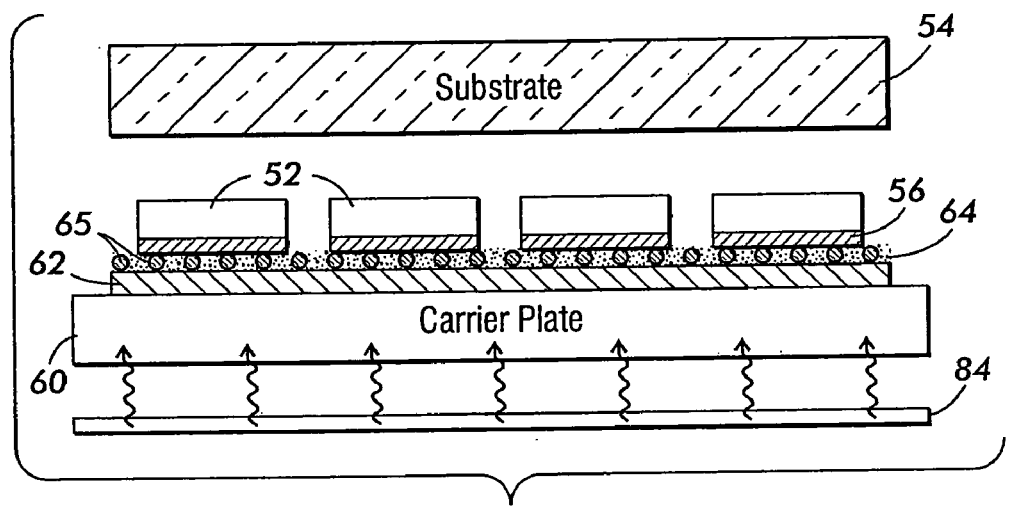
FIG. 7B

FIG. 11
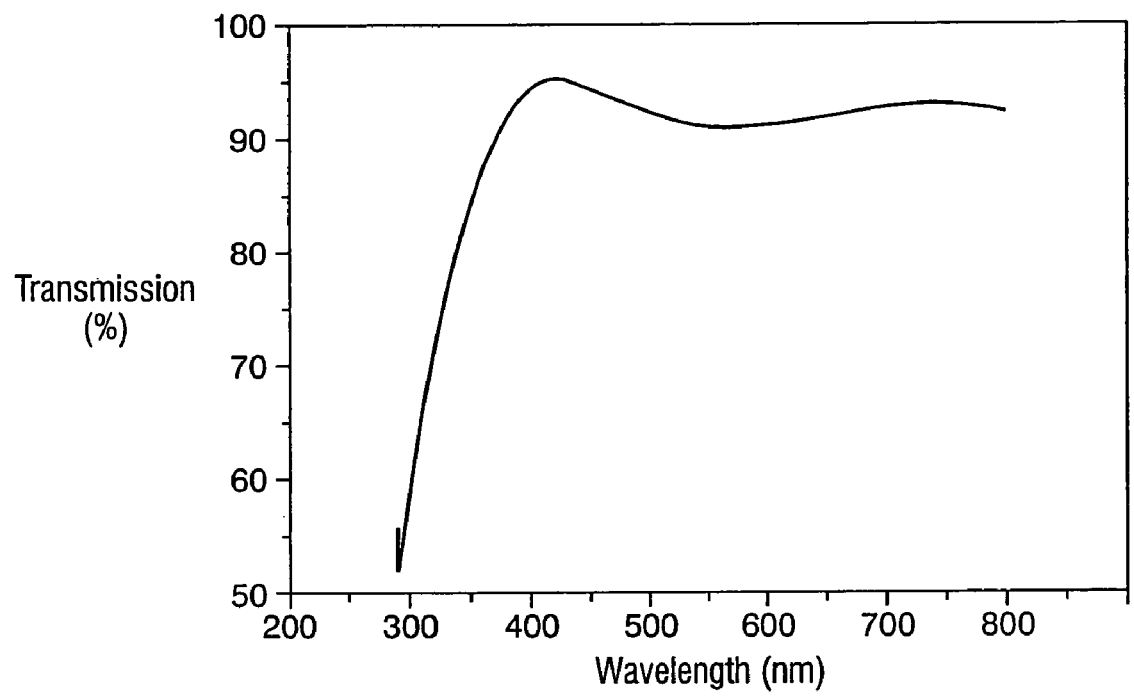
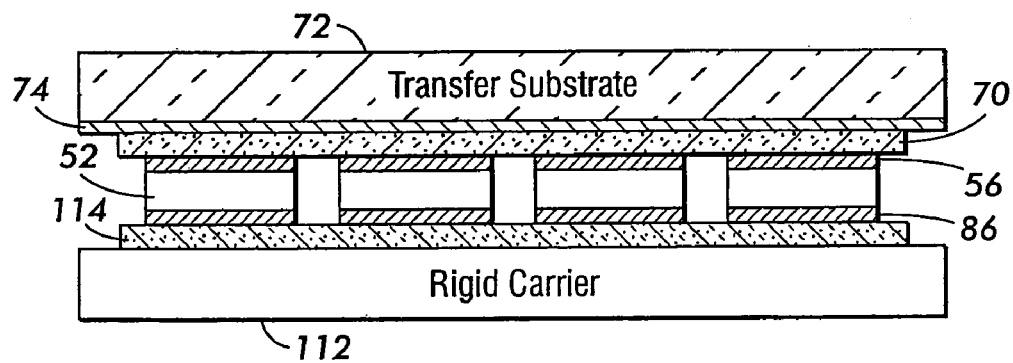
FIG. 12

*FIG. 13*
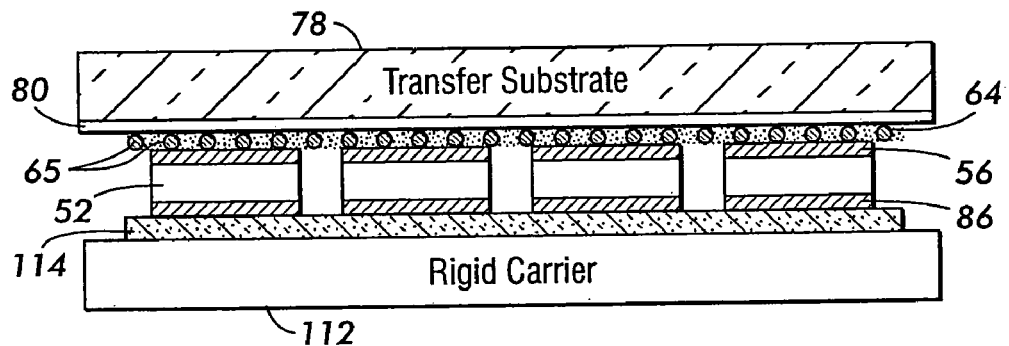
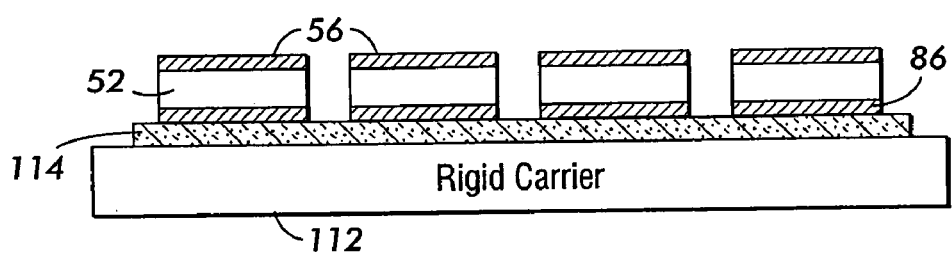
*FIG. 14*
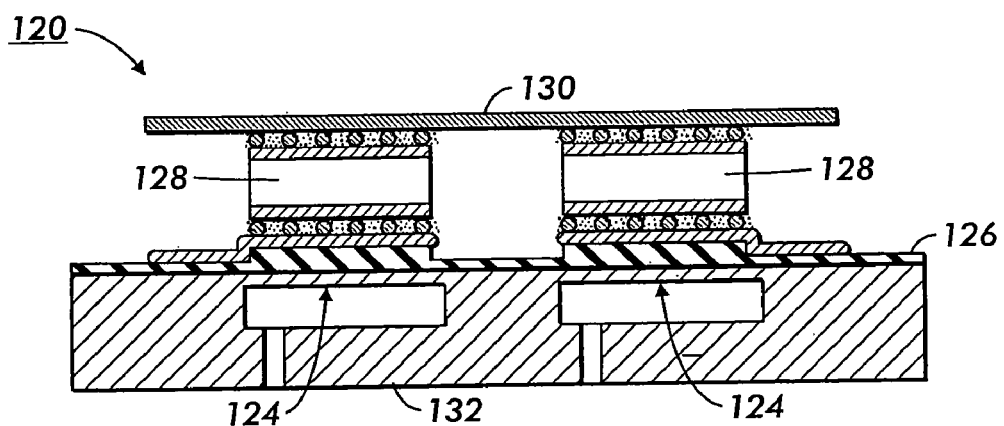
*FIG. 15*

FIG. 19
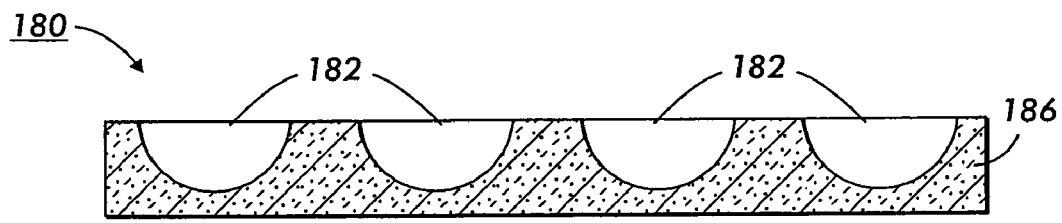
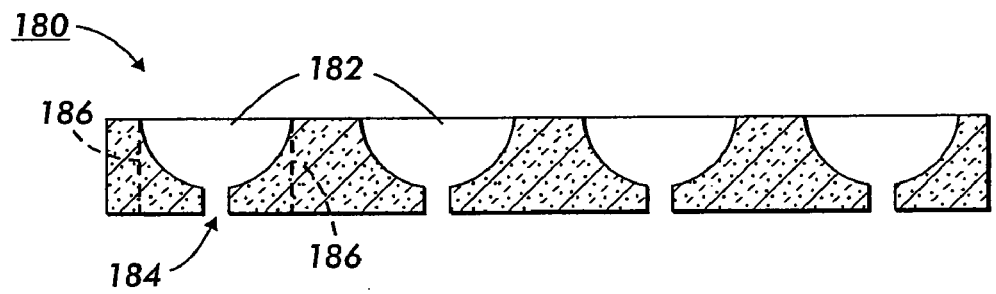
FIG. 20
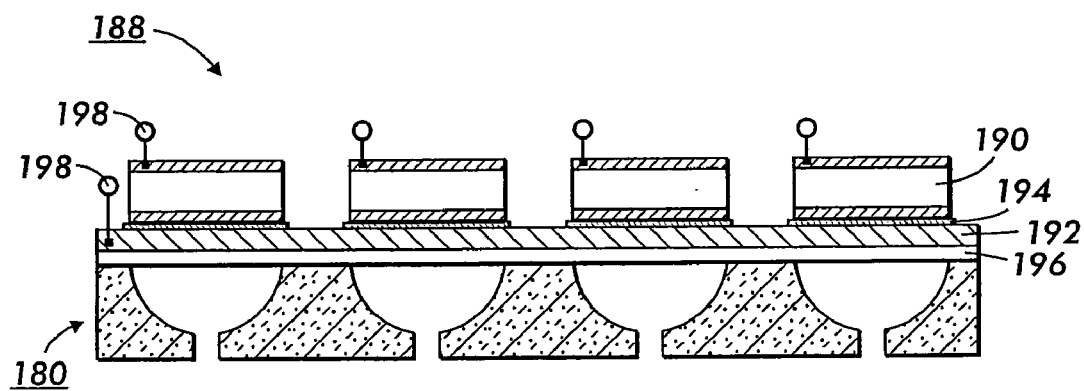
FIG. 21

METHODS FOR MAKING THICK FILM ELEMENTS

This is a divisional of U.S. patent application Ser. No. 10/376,544, filed Feb. 25, 2003 now U.S. Pat. No. 7,089, 635, entitled "METHODS TO MAKE PIEZOELECTRIC CERAMIC THICK FILM ARRAY AND SINGLE ELEMENTS AND DEVICES."

BACKGROUND OF THE INVENTION

The present application is directed to piezoelectric material production and more particularly to a process for manufacturing piezoelectric thick film elements and arrays of elements, and structures incorporating such elements.

Piezoelectric ceramic films, e.g., lead zirconate-lead titanate (PZT) and its modified forms are generally defined as being either thin-film elements, up to approximately 10 μm in thickness, or thick-film elements, being approximately greater than 10 μm in thickness. Thin-film piezoelectric elements and thick-film piezoelectric elements greater than approximately 10 μm thick, can be used in a wide variety of applications, including but not limited to microelectromechanical systems (MEMS), microfluid pumps or ejectors, such as jet printheads or acoustic ejectors, and ultrasonic transducers.

Unfortunately, elements in the range of greater than 10 μm to 100 μm are not now able to be produced in high volume with economical yields which permit commercialization. Rather, current methods to make the films in such thickness range are either by polishing the bulk ceramic pieces from more than 100 μm down to the required thickness or using a sol-gel hybrid (or composite) process. The first method is a time-consuming and expensive process which does not lend itself to the making of patterns or arrays. The thick films obtained by the second method have very low quality, are difficult to be patterned, and the required annealing step at 500 to 700° C. limits the substrates which may be used. Thus, there are no cost-effective methods to make high-quality, thick film (greater than 10 to 100 μm) individual elements and arrays, with the elements having arbitrary shapes and on anykind of substrate including silicon, metal and plastics or epoxies.

For many of these applications, the so called thick films, with the thickness range from greater than 10 to 100 μm, are considered beneficial in order to generate a large displacement, apply a large force, to provide a suitable working frequency ranges, and to optimize the performance of actuation or sensing systems. For example, in an existing piezoelectric inkjet printhead, with a stainless steel diaphragm having a thickness of 25 to 40 μm, the thickness of the piezoelectric elements should be about 40 to 70 μm for an optimized design.

Piezoelectric films with the thickness range of greater than 10 to 100 μm are also useful for high frequency (20 to 200 MHz) transducers and catheters used in imaging, such as imaging of arterial walls, structures in the anterior chamber of the eye, and intravascular ultrasound imaging.

These applications may find use for both single element transducers and transducer arrays. For these applications it may be useful to provide the piezoelectric films on polymers, such as some epoxies, which works as backside materials to absorb or diminish backside ultrasonic waves for better image quality, or other advantages.

However, to fabricate piezoelectric films in a greater than 10 to 100 μm thickness range on suitable substrates for such uses is very difficult for current thin and thick film processes. This is because, the traditional thin film processes, such as sol-gel processing, sputtering and chemical vapor deposition, can only practically generate films with thickness up to 10 μm range. It is also not efficient to use these thin film processes to produce thick films even if they could do so. On the other hand, the traditional thick film processes, such as screen printing, can produce thick films only on the substrates which can withstand higher than 1100° C. temperatures because the screen printed films have to be sintered at about 1100 to 1350° C. for densification and to get good properties.

While a sol-gel hybrid (or composite) method, in which ceramic powders are suspended in a sol-gel solution for spin coating, has been developed at Queen's University of Canada to prepare 0–3 ceramic (powders)/ceramic (sol-gel matrix) composite films with the thickness of 10 to 80 μm on silicon and metal substrates, there are still several drawbacks for this method. First, the film density, and hence the film quality is very low because of low densification process and no grain growth of powders during sintering. Secondly, the film is very difficult to etch or pattern due to its inhomogeneous nature in micrometer scale. Thirdly, as the films have to be sintered at 600 to 700° C., this method can not be used to deposit films on polymers or other substrates which can not withstand 600° C. or higher.

U.S. Pat. No. 6,071,795 to Cheung et al. provides a method of separating a thin film of gallium nitride (GaN) epitaxially grown on a sapphire substrate. The thin film is bonded to an acceptor substrate, and the sapphire substrate is irradiated by a radiation source (such as a laser or other appropriate device) with abeam at a wavelength at which sapphire is transparent but the GaN is strongly absorbing, e.g., 248 nm. After the irradiation, the sample is heated above the melting point of gallium (Ga), i.e., above 30° C., and the acceptor substrate and the attached GaN thin film are removed from the sapphire growth substrate. It was noted that at about 400 mJ/cm$^2$, one pulse of the laser was sufficient to separate the epitaxially grown film of GaN from the sapphire substrate. It is also noted in a specific embodiment, the thin film of the GaN is grown to a thickness of 3 μm.

It is considered that the high energy levels required for the separation process of the thin film GaN, is in part due to the fact that the GaN is epitaxially grown on the substrate, resulting in a degree of lattice matching between the GaN film and the sapphire substrate. This relationship results in a strong adhesive energy between the substrate and GaN.

It is therefore deemed desirable to develop a process which can effectively deposit greater than 10 to 100 μm-thick piezoelectric films on various substrates (silicon, metals, polymers), where the films can be easily patterned during the process, and can produce identical, large-quantity, high-quality thick film elements detachable from the substrate.

SUMMARY OF THE INVENTION

A material for a thick film element is deposited onto a surface of a first substrate to form a thick film element structure having a thickness of between greater than 10 μm to 100 μm. The at least one thick film element structure is bonded to a second substrate. Thereafter, the first substrate is removed from the at least one thick film element structure using a liftoff process which includes emitting, from a radiation source (such as a laser or other appropriate device), a radiation beam through the first substrate to an attachment interface formed between the first substrate and the at least one thick film element structure at the surface of the first substrate. The first substrate is substantially transparent at the wavelength of the beam, and the beam generates sufficient energy at the interface to break the attachment.

SUMMARY OF THE DRAWINGS

The invention may take form in various components and arrangements of components, and in various steps and arrangements of steps. The drawings are only for purposes of illustrating preferred embodiments and are not to be construed as limiting the invention.

FIG. 7A illustrates radiation of a beam through the carrier substrate during a liftoff process;

FIG. 7B depicts a heat transfer for the liftoff process;

FIG. 11 is a chart depicting transmission wavelength of a beam used in a process of the present application;

FIG. 12 illustrates a case where removable conductive tape is used in the configuration of a piezoelectric element array;

FIG. 13 depicts a case of a thin, nonconductive epoxy bonding containing sub-µm conductive balls being used to bond the thick film elements to an ITO-coated glass as a transfer substrate;

FIG. 14 illustrates a case of a thick film element being bonded to a rigid carrier using a removable tape;

FIG. 15 depicts a structural application of a microfluid pump such as a printhead in which the piezoelectric elements of the present application may be implemented;

FIG. 19 depicts an initial fabrication state of the ink cavity body according to the concepts of the present application;

FIG. 20 depicts nozzle inputs and an open surface design which may be employed in the concepts of the present application;

FIG. 21 sets forth an ejector which may be constructed in accordance with the teachings of the present application.

DETAILED DESCRIPTION OF THE INVENTION

Figure 1:
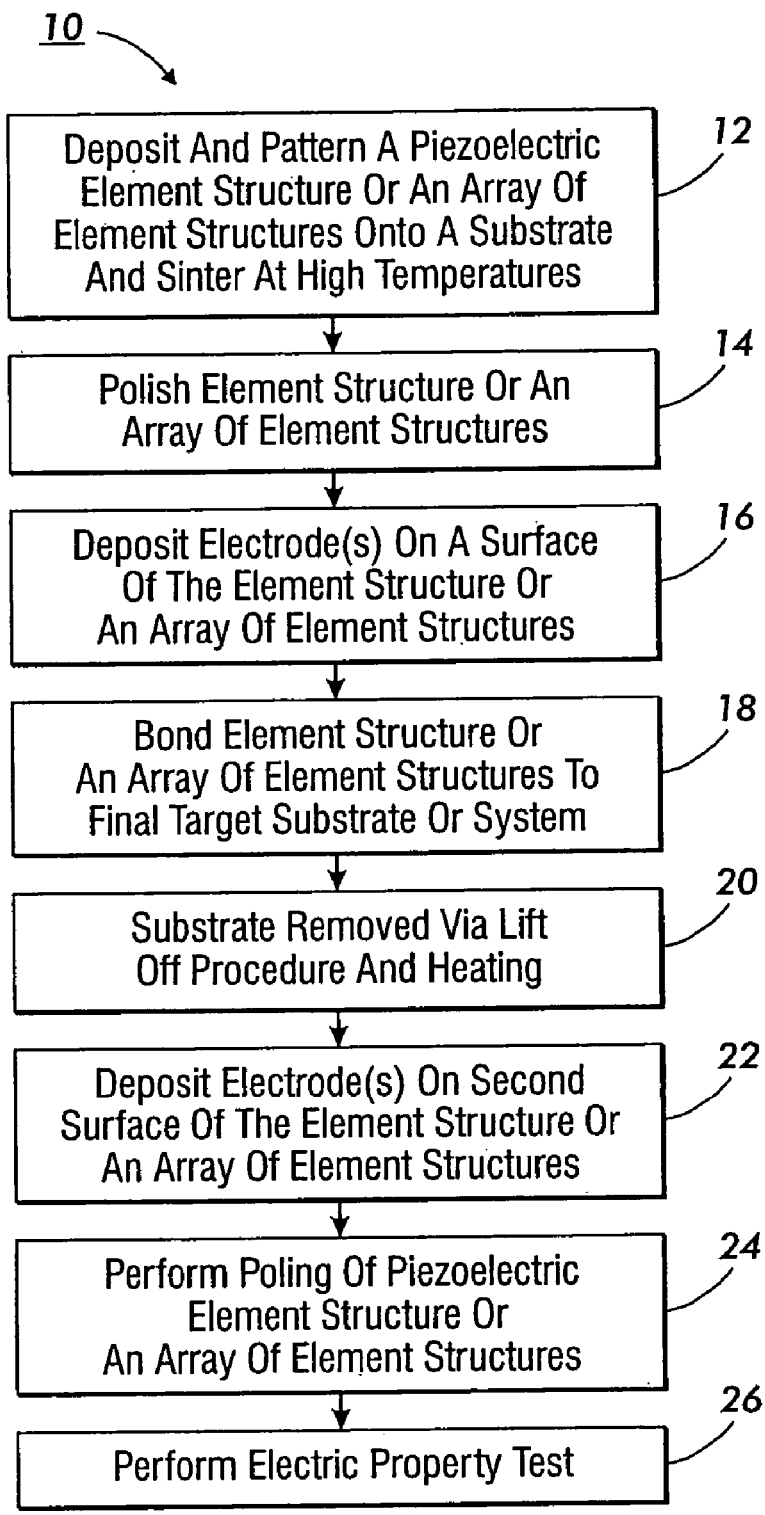
FIG. 1 is a high level process flow for piezoelectric element production and direct bonding to a final target substrate or system.

FIG. 1 illustrates a high level process flow 10 for a first embodiment of a manufacturing process according to the concepts of the present application. While the following discussion focuses on producing piezoelectric thick film elements, it is to be appreciated the disclosed processes may be used with other materials and may also be used for production of thin-film elements and elements with thicknesses greater than 100 µm to a millimeter scale. Also, the following techniques are intended to be applicable to the generation of individual elements and arrays of elements.

Initially, piezoelectric ceramic thick film, or an array of thick film elements, is fabricated by depositing the piezoelectric material onto an appropriate substrate by use of a direct marking technology 12. In the deposition techniques. employed, ceramic type powders are used in a preferred embodiment. The fabrication process includes sintering the material preferably at a temperature of approximately 1100 to 1350° C. for desification, although other temperature ranges may also be used in appropriate circumstances. Following the fabrication process the surface of the formed structures of piezoelectric elements are polished 14, preferably using a drytape polishing technique. Once the piezoelectric elements have been polished and cleaned, electrodes are deposited on the surface of the piezoelectric elements 16. Next, the piezoelectric elements are permanently bonded to a final target 18, such as to a substrate or as part of a larger system. Typically, the composition of the piezoelectric ceramic thick film is doped or undoped PZT, but any other piezoelectric materials, such as lead titanate, lead zirconate, lead magnesium titanate and its solid solutions with lead titanate, lead zinc titanate and its solid solutions with lead titanate, lithium niobate, lithium tantanate, and others may be used.

At this point, the substrate on which the piezoelectric elements were deposited is removed through a liftoff process 20 using radiation energy such as from a laser or other appropriate device. The releasing process involves exposure of the piezoelectric elements to a radiation source through the substrate, to break an attachment interface between the substrate and the piezoelectric elements. Additional heating is implemented, if necessary, to complete removal of the substrate. Once the liftoff process has been completed, a second electrode is deposited on a second surface of the piezoelectric material 22. Thereafter, poling of the elements under high voltage obtains piezoelectric properties in the material 24. The electric property, for example, a dielectric property, of each element is then measured 26 to identify if the elements meet required criteria.

Figure 2:
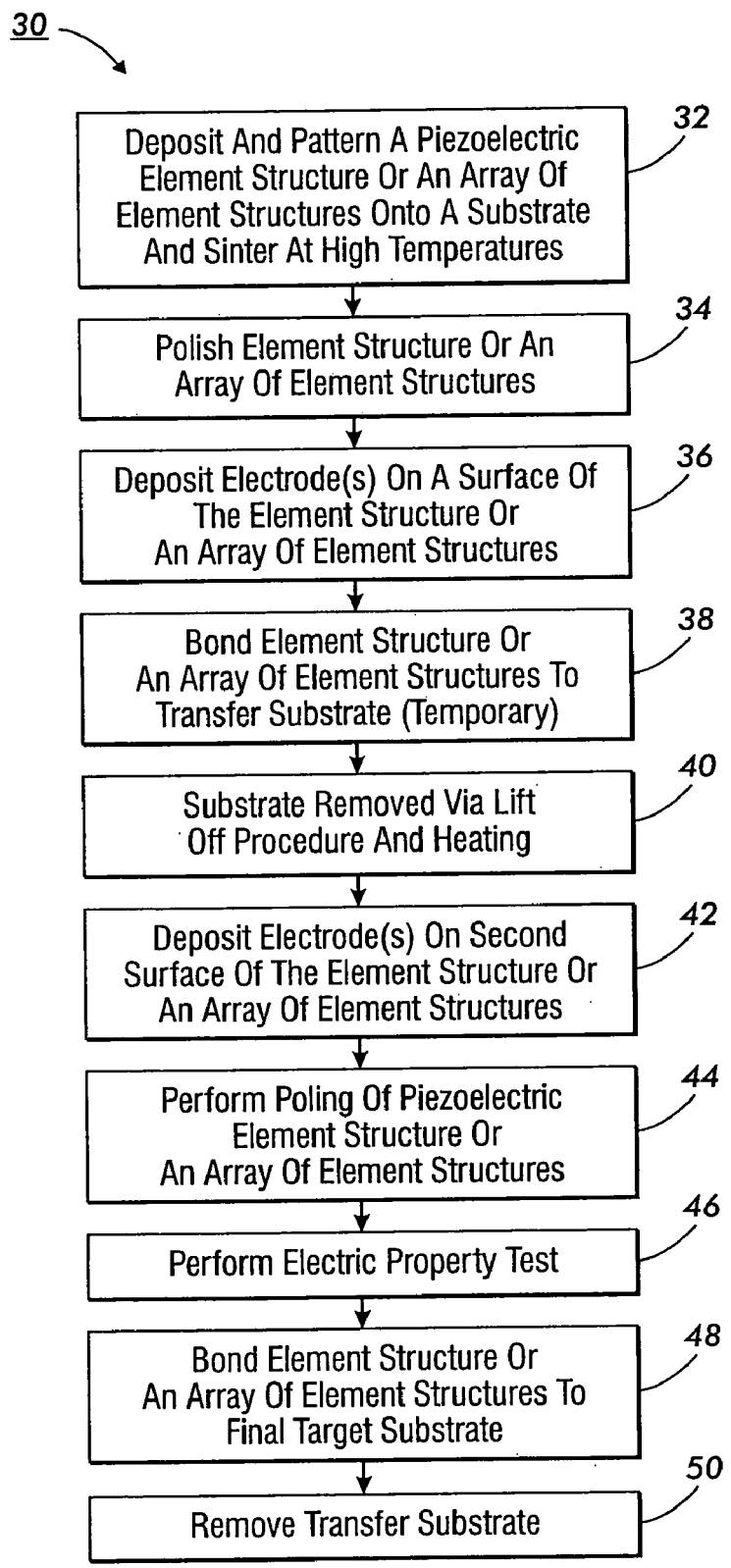
FIG. 2 is a high level process flow for piezoelectric element production including attachment of the piezoelectric elements to a transfer substrate prior to transfer to a final target substrate or system.

Turning to FIG. 2, illustrated is a second high-level process flow 30 for a second embodiment of the present application. This process differs from FIG. 1 in that the bonding is to a transfer substrate rather than to a final target substrate or system. Thus, the fabrication step 32, the tape polishing step 34 and the electrode depositing step 36 are performed in the same manner as steps 12, 14 and 16 of FIG. 1. At bonding step 38, the bonding is to a transfer substrate, as this connection is not intended to be permanent. Thereafter, the liftoff step 40, the second electrode deposition step 42, the poling step 44 and electric property test step 46, which correlate to steps 20, 22, 24 and 26 of FIG. 1, are performed.

The piezoelectric elements are then bonded to a final target substrate or system 48, in a procedure similar in design to step 18 of FIG. 1. Following bonding step 48, the transfer substrate is removed 50. When bonding to a final target substrate or system, a thin high strength bonding layer is used to minimize or avoid undesirable mechanical damping or absorption of the bonding layer. This bonding will, however, also permit maintaining of electrical contact between the metal electrodes on the piezoelectric elements and the final target substrate or system or a conductive surface of the final target substrate or system.

Employing the process of FIG. 2, only fully tested thick film elements and arrays will be bonded to final target substrates or systems, thus avoiding yield loss of the target substrates or systems.

The processes of FIGS. 1 and 2 are appropriate for the production of single piezoelectric elements or arrays of the elements, and permit for high volume, high usable yields, i.e. greater than 60 percent and more preferably over 90 percent, and still yet more preferably greater than 98 percent.

Figure 3:
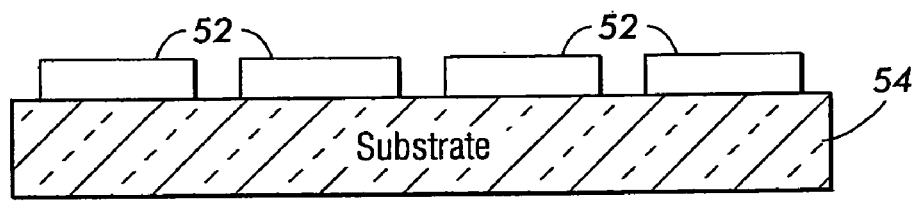
FIG. 3 illustrates a piezoelectric element array on a top surface of a carrier substrate.

With attention to FIG. 3, which illustrates steps 12 and 32 in greater detail, piezoelectric ceramic elements 52 are deposited on an appropriate substrate 54, and then sintered at 1100 to 1350° C. for densification. The depositing step may be achieved by a number of direct marking processes including screen printing, jet printing, ballistic aerosol marking (BAM) or acoustic ejection, among others. Using these techniques permits flexibility as to the type of piezoelectric element configurations. For example, when the piezoelectric elements are made by screen printing, the screen printing mask (mesh) can be designed to have various shapes or openings resulting in a variety of shapes for the piezoelectric elements, such as rectangular, square, circular, ring (for annular transducer arrays), among others. Use of these direct marking techniques also permit generation of very fine patterns.

The substrate used in the processes of this application will have certain characteristics, due to the high temperatures involved and—as will be discussed in greater detail—the fact that the substrate is to be transparent for the liftoff process. Specifically, the substrate is to be transparent at the wavelengths of radiation beam emitted from the radiation source, and is to be inert at the sintering temperatures so as not to contaminate the piezoelectric materials. A particularly appropriate substrate is sapphire. Other potential substrate materials include transparent alumina ceramics, aluminum nitride, magnesium oxide, strontium titanate, among others. In one embodiment of the process, the substrate selected is transparent for a radiation source, such as an excimer laser operating at a wavelength of 308 nm, and does not have any requirement on its crystallographic orientation. It is preferable that the selected substrate material be reusable, which will provide an economic benefit to the process.

After fabrication of the elements has been completed, the process moves to step 14 (or 34), where the top surface of the piezoelectric elements are polished through a tape polishing process to remove any surface damage layer, such as due to lead deficiency. This step ensures the quality of the piezoelectric elements and homogenizes the thickness of piezoelectric elements. By having a homogenized thickness, each of the piezoelectric elements of an array will bond to the final target system or the transfer substrate even when a very thin epoxy bonding layer or a thin film intermetallic transient liquid phase bonding layer is used.

In one preferred embodiment, the tape polishing step is a dry tape polishing process that provides a planar flat polish out to the edge of the surfaces of the piezoelectric elements, which avoids a crowning effect on the individual elements. Compared to a wet polishing processes, the dry tape polishing does not cause wearing of the edges of the piezoelectric elements, making it possible to fabricate high-quality, thickness and shape-identical piezoelectric elements. Once polishing has been completed, the surface is cleaned, in one instance by application of a cleaning substance.

Figure 4A:
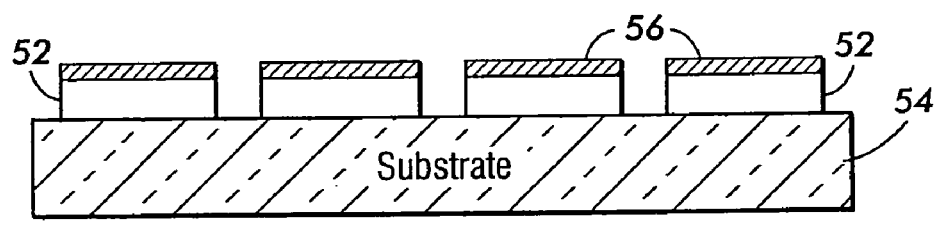
FIGS. 4A and 4B show alternative embodiments of a piezoelectric element array deposited with electrodes and other thin film metals for bonding, the piezoelectric element array is on a top surface of a carrier substrate.

After polishing and cleaning, the process moves to step 16 (or 36) where, as shown in FIG. 4A, metal electrodes 56 such as Cr/Ni or other appropriate materials, are deposited on the surface of the piezoelectric elements by techniques such as sputtering or evaporation with a shadow mask. The electrode can also be deposited a direct marking method, such as screen printing, and sintered at suitable temperatures.

Alternatively, when using a thin film intermetallic transient liquid phase bonding process, certain low/high melting-point metal thin film layers maybe used as the electrodes for the piezoelectric elements, thus in some cases it is not necessary to deposit the extra electrode layer such as Cr/Ni. However, preferably the thin film intermetallic transient liquid phase bonding process is undertaken after metal electrode deposition, such as Cr/Ni deposition. While this process will be discussed in greater detail below, generally a thin film layer of high melting-point metal 58 (such as silver (Ag), gold (Au), Copper (Cu), Palladium (Pd)) and a thin film layer of low melting-point metal 59 (such as Indium (In), Tin (Sn)) may be deposited on the piezoelectric elements (or the substrate) and a thin layer of high melting-point metal (such as Ag, Au, Cu, Pd) may be deposited on the substrate (or the piezoelectric elements). These materials are then used to form a bond. Also a multilayer structure with alternating low melting-point metal/high melting-point metal thin film layers can be used.

Figure 5A:
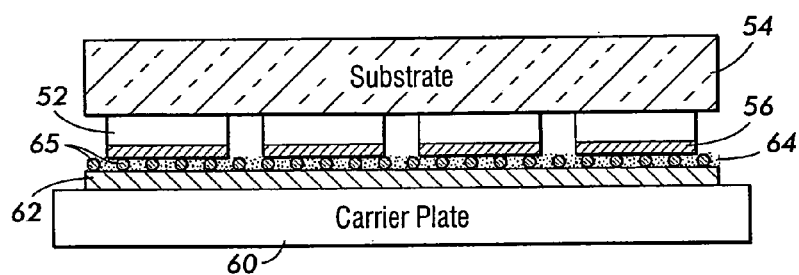
FIG. 5A illustrates an embodiment of a bonding of piezoelectric films to a final target which is conductive using a thin, nonconductive epoxy bonding containing sub-µm (micrometer) conductive balls.
Figure 5B:
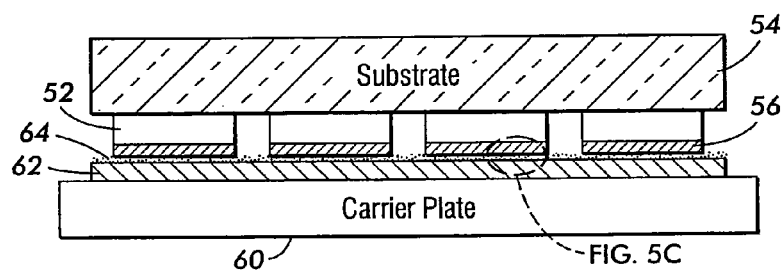
FIG. 5B shows a nonconductive epoxy bonding process.

For some uses, such as when the final target substrate or system is not expensive, the piezoelectric elements are directly bonded to the final target substrate or system (step 18 of FIG. 1). For example, as depicted in FIGS. 5A and 5B, the final target could be a metal foil (also used as common electrode) 62, which is put on a carrier plate 60 during the process. The bonding is accomplished by using a nonconductive epoxy layer 64 which can be as thin as less than 1 µm. The thin epoxy contains sub-µm conductive particles, which in one embodiment may be conductive balls (such as Au balls) 65 so the epoxy is conductive in the Z direction (the direction perpendicular to the surface of metal foil). Thus it can keep the electric contact between the surface electrode of the piezoelectric elements and the metal foil. The concentration of the conductive balls can be controlled in such a range that the cured thin epoxy is conductive in the Z direction but not conductive in the lateral directions, as done for the anisotropic conductive films. The shrinkage of the epoxy maintains contact between the surfaces and the balls in the Z direction.

Figure 5C:
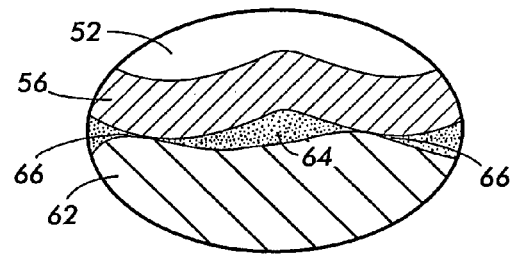
FIG. 5C is an enlarged view of a section of FIG. 5B.

In an alternative embodiment shown in FIGS. 5B and 5C, conductive balls 65 are removed, and bonding is accomplished using the nonconductive epoxy layer 64 alone. As shown in more detail by FIG. 5C, electrical contact is maintained via electrical contact points 66, formed when the surface of the electrode 56 and metal foil 62 are moved into contact, with suitable surface roughness or asperity of the piezoelectric films and/or metal foil.

Figure 5D:
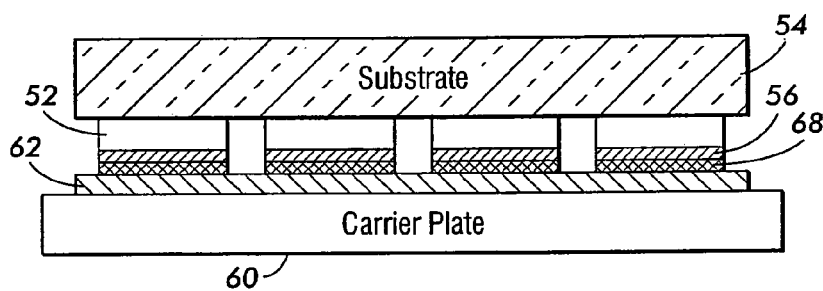
FIG. 5D illustrates a bonding of piezoelectric films to a final target using thin film intermetallic transient liquid phase bonding.

In a further embodiment, bonding to the final target maybe accomplished by using the previously mentioned thin film intermetallic transient liquid phase bonding, employing in one embodiment a high melting-point metal (such as Ag, Cu, Pd, Au, etc.)/low melting-point metal (such as In, Sn) intermetallic compound bonding layer or alloy 68, FIG. 5D.

Figure 4B:
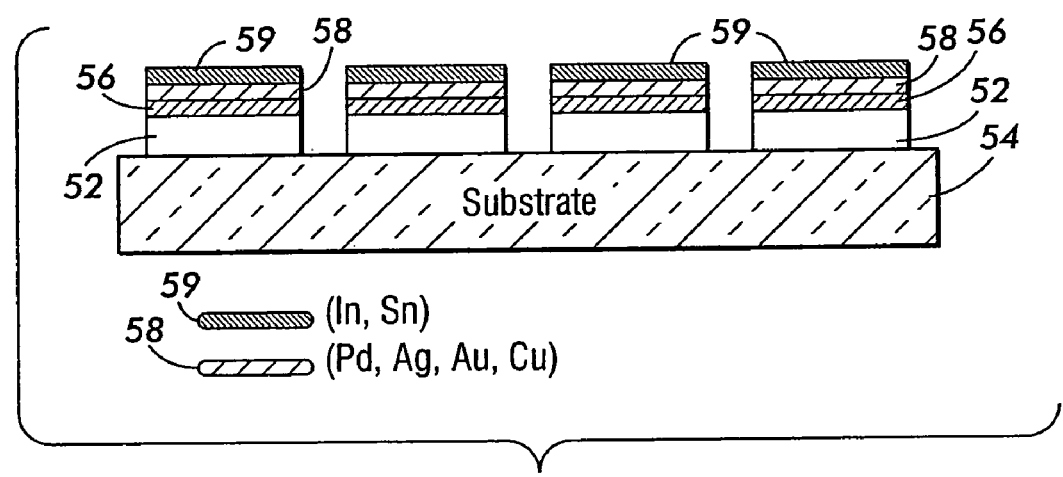

More particularly, for thin film intermetallic transient liquid phase metal bonding, a high melting-point metal thin layer, such as a Pd thin layer, is deposited on the target substrate or system. Next the piezoelectric elements are moved into contact with the Pd thin layer and heated under pressure above the melting point of the low melting-point metal, e.g., about 200° C. By this operation the high melting-point metal/low melting-point metal/high melting-point metal combination, such as Pd/In/Pd layer (a high melting-point metal/low melting-point metal such as Pd/In layer was previously deposited on the piezoelectric elements as shown in FIG. 4B) will form the high melting-point metal-low melting-point metal bonding layer compound or alloy 68. This compound or alloy may be a $PdIn_3$ alloy layer which is about 1 µm-thick, which acts to bond piezoelectric elements 52 and target substrate or system 62. Functionally, the low melting-point metal diffuses into the high melting-point metal to form the compound/alloy.

As the melting point of the formed intermetallic compound phase can be much higher than that of the low melting-point metal, the working temperature of the bonding layer can be much higher than the temperature used to form the bonding. For example, when Indium (In) is used as the low melting-point metal and Palladium (Pd) is used as the high melting-point metal, the bonding can be finished below or at 200° C. as the melting point of In is about 156° C. However, the working temperature of the formed intermetallic compound bonding layer, $PdIn_3$, can be well above 200° C. because the melting point of $PdIn_3$ is about 664° C. The thickness of the bonding layer could be from 1 to 10 µm, but a thinner bonding layer (e.g., about 1 µm) is expected for this purpose. Further, the amount of high and low melting-point metals can be controlled so they will be totally consumed to form the intermetallic bonding layer.

Figure 5E:
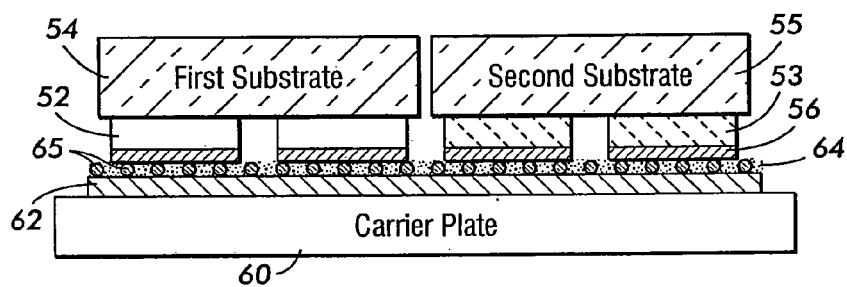
FIG. 5E depicts an embodiment using separate substrates for depositing of the elements.

In some situations, a final system may be larger than a substrate on which elements are deposited. In other situations, different types of piezoelectric materials—such as soft PZT and hard PZT—or piezoelectric material and other ceramic material, are intended to be transferred to the same final target system. In either of these instances, as shown in FIG. 5E, the materials can be deposited on separate substrates, or each different piezoelectric material, or each piezoelectric material and each other ceramic material can be deposited on each substrate separately, then sintered at suitable temperatures. Then each of the elements may have electrodes deposited on their surfaces. After that, substrates with different material can be bonded to the same final system. For example, in FIG. 5E two substrates—a first substrate 54 deposited with piezoelectric elements 52, and a second substrate 55 deposited with elements 53 (which could be piezoelectric or other ceramic materials such as antiferroelectric material)—are bonded to the same final substrate 62 using thin epoxy bonding 64 containing sub-µm conductive balls 65. Clearly, similar cases can also be applied to use other bonding methods, and to the case where a transfer substrate is used rather than directly bonded to the final target system, such as is described in detail later. When the process with transfer substrate is used, several transfer substrates can also be used.

Alternatively, when the final target substrate or system is expensive, bonding of the piezoelectric elements to the final target is delayed. Incorporation of the steps in FIG. 2 minimizes yield loss of the final target substrate or system, which might otherwise occur due to piezoelectric film fabrication failures. Examples of where this process may be implemented include the manufacture of micro-fluid pumps, such as jet printheads and acoustic ejectors, or silicon wafers having complicated pattern configurations and electric circuits. The non-piezoelectric components of these devices can be ten times more expensive than the piezoelectric materials. Therefore, the process of FIG. 2 temporarily bonds the piezoelectric elements to a transfer substrate in step 38, and then finishes piezoelectric film production and testing. Only a fully tested piezoelectric thick film element or array of elements is then permanently bonded to the target substrate or system.

Figure 6A:
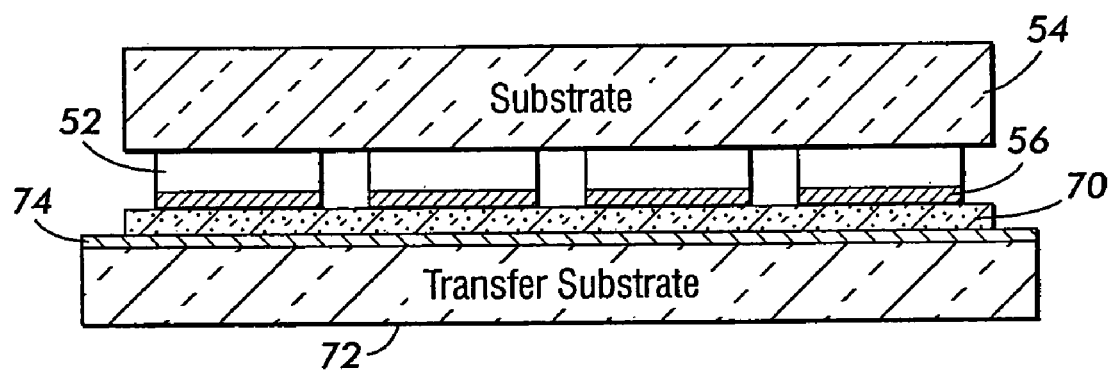
FIG. 6A depicts a bonding to a transfer substrate which is conductive using a removable conductive tape bonding.
Figure 6B:
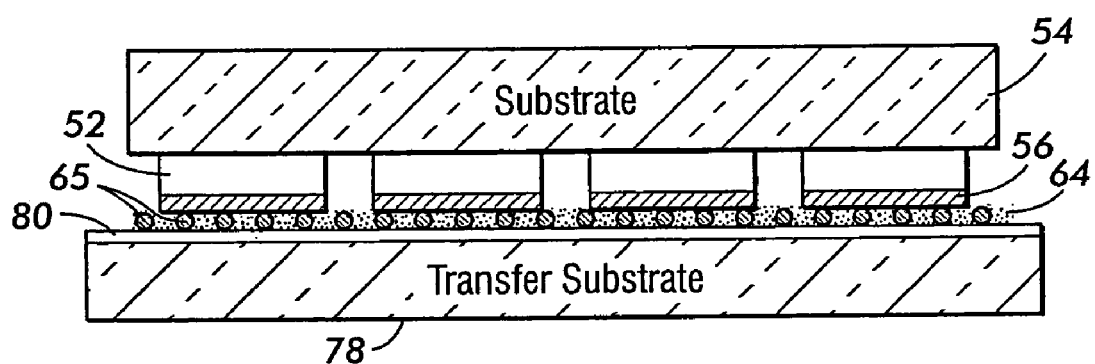
FIG. 6B illustrates a bonding of the piezoelectric films to the transfer substrate which is an Indium-Tin-Oxide (ITO)-coated glass using thin, nonconductive epoxy bonding containing sub-µm conductive balls.

The temporary bonding process step 38 of FIG. 2, is illustrated by FIGS. 6A and 6B. In FIG. 6A, the bonding operation uses a removable conductive bonding epoxy, such as a removable conductive tape 70, including 9712,9713 and 9719 conductive tape from 3M Corporation. The transfer substrate 72 can be a metalized glass with surface conductive layer 74, such as a metalization layer. In an alternative embodiment depicted in FIG. 6B, the bonding operation uses thin nonconductive epoxy 64 containing sub-µm conductive balls 65, to bond to a transfer substrate 78 such as a glass having an ITO coating 80.

It is noted that to manufacture ready-to-use single piezoelectric thick film elements as the final product, the individual piezoelectric elements will also be bonded to a transfer substrate.

Once the piezoelectric elements have been either permanently bonded to a final target substrate or system (step 18 of FIG. 1) or temporarily bonded to a transfer substrate (step 38 of FIG. 2), the next step is to release the piezoelectric elements 52 from substrate 54. The releasing of substrate 54 is accomplished by a liftoff operation as depicted in FIGS.

7A and 7B. The following description is based on the arrangement of FIG. 5A. However, it is applicable to all provided alternatives. Substrate 54 is first exposed to a radiation beam (such as a laser beam) from a radiation source (such as an excimer laser source) 82, having a wavelength at which the substrate 54 is substantially transparent. In this way a high percentage of the radiation beam passes through the substrate 54 to the interface of the substrate and elements 52 at the surface of the substrate. The energy at the interface acts to break down the physical attachment between these components. Following operation of the radiation exposure, and as shown in FIG. 7B, heat is applied by a heater 84. While the temperature provided by the heater will vary depending on the situation, in one embodiment a temperature of between 40 to 50° C. is sufficient to provide easy detachment of any remaining contacts to fully release the piezoelectric elements 52 from substrate 54. Desirably, the substrate is of a material that allows it to be re-used after a cleaning of its surface.

In one experiment performed by the inventors, the radiation source is an excimer laser source and the laser energy required to achieve separation by the present procedure has been measured at about one-half what is mentioned as needed in the Cheung et al. patent. This is considered in part due to the wavelength used in the experiment (e.g., 308 nm), and also that the piezoelectric material is polycrystalline and was screen printed on substrates, therefore more weakly bound to the substrate compared to the epitaxially grown single crystal films used in the previous work by Cheung et al.

Exposure to the radiation source does raise the potential of damage to the surface of the piezoelectric elements, this potential damage should however be no more than to a thickness of about 0.1 µm. Since the thickness of the piezoelectric elements, in most embodiments, will be larger than 10 µm, the effect of the surface damage layer can be ignored. However, if otherwise necessary or when piezoelectric elements of less than 10 µm are formed by these processes, any surface damage layer can be removed by appropriate processes including ion milling or tape polishing. It is to be appreciated FIGS. 7A and 7B are simply used as examples, and the described liftoff process may take place using alternatively described arrangements. Also, for convenience, FIGS. 7A and 7B corresponds to the structure of FIG. 5A. However, the same types of procedures may be applied to FIGS. 5B to 5E, FIGS. 6A and 6B or other relevant arrangements in accord with the present teachings.

Figure 8A:
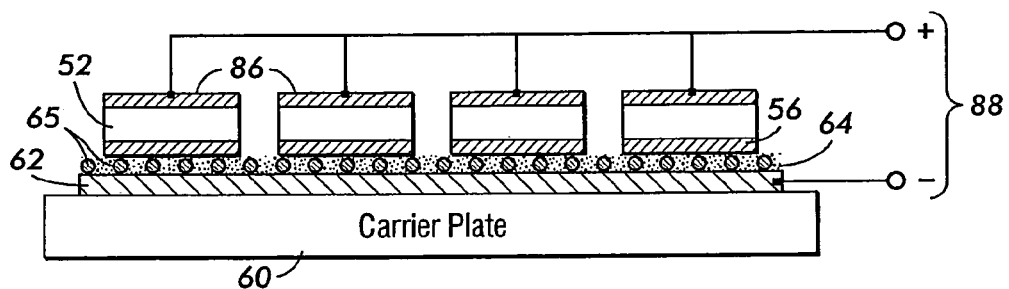
FIGS. 8A and 8B are alternative designs of bonding the thick film array to a final target substrate or system or to a transfer substrate, with poling operation.
Figure 8B:
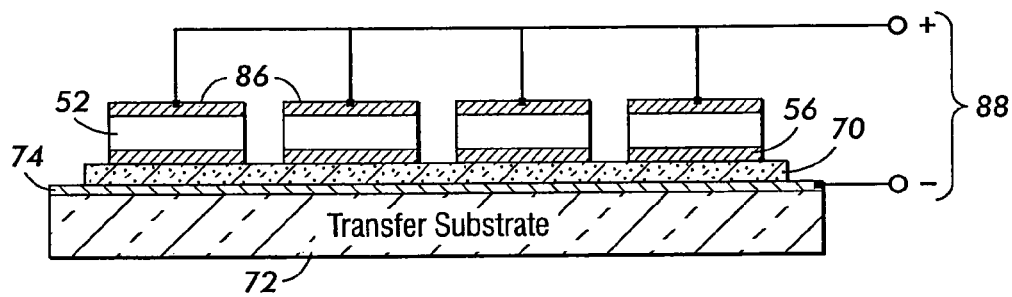

Next, as depicted in FIGS. 8A and 8B, second side surface electrodes 86, such as Cr/Ni, are deposited on the released surfaces of elements 52 with a shadow mask or by other appropriate method in accordance with step 22 of FIG. 1 or step 42 of FIG. 2. After second electrode deposition, the processes move to steps 24 and 44, respectively, where the piezoelectric elements 52 are poled under a voltage 88 sufficient, as known in the art, to obtain piezoelectric properties. After poling, the electric property, for example, the dielectric property, of the elements are measured (step 26 of FIG. 1; step 46 of FIG. 2) to identify if the piezoelectric elements meet expected quality criteria. FIG. 8A corresponds to the arrangement shown in FIG. 5A, and FIG. 8B corresponds to the arrangement of FIG. 6A.

For the case where a piezoelectric thick film element or array of elements is already bonded to the final target substrate or system such as by the process of FIG. 1, this is the final step of the process. For the case where the piezoelectric thick film element or array of elements is temporally bonded to a transfer substrate such as by the process of FIG. 2, steps 48 and 50 are undertaken. In the following these steps are implemented using selected ones of the alternative arrangements previously described. It is to be understood the discussion in connection with these alternatives are applicable for all disclosed alternative designs.

As mentioned, the piezoelectric element or array of elements is temporally bonded to a transfer substrate in situations where, for example, the final target substrate or system is much more expensive than the piezoelectric thick film elements. By use of this temporary bonding, it is only after electric property measurement is made that the piezoelectric element or array is bonded to the final target.

Step 48 of FIG. 2 may be accomplished in the same manner as bonding step 18 of FIG. 1. FIGS. 9A–9D, show alternative bonding methods, including a thin nonconductive epoxy bonding containing sub-µm conductive balls (FIG. 5A) and a thin film intermetallic transient liquid phase bonding (FIG. 5D). Still further, the process could employ the thin nonconductive epoxy bonding of FIGS. 5B and 5C. When this process is used, the surface roughness or asperity of the piezoelectric elements/or and the substrate is preferably in a range of about 0.5 to 5 µm, depending on film thickness, nature of the substrate, as well as the intended use. The second surface of the piezoelectric elements could be very smooth due to the smooth nature of the substrate surface. This means that, after liftoff, rough tape polishing, sandblasting or other methods may be needed to increase the surface roughness. It is to be understood the surface roughness will be a small fraction of the overall thickness of the piezoelectric element and/or substrate. The specific roughness being selected in accordance with a particular implementation.

If the thin film intermetallic transient liquid phase bonding is used, similar to previous steps, a high melting-point metal/low melting-point metal such as Pd/In electrode is deposited on the second surface of the thick film elements and a thin high melting-point metal such as Pd layer is deposited on the surface of the final target system.

It is to be appreciated the surface of the final target system is to be conductive. Therefore, either the body of the final target system is conductive, such as a stainless steel printhead, or the surface of the final target system is conductive, such as metalized silicon wafers for MEMS applications. Further, FIGS. 9A–9D are related to the process of FIG. 2, where the first bonding step is to a temporary connection.

Figure 9A:
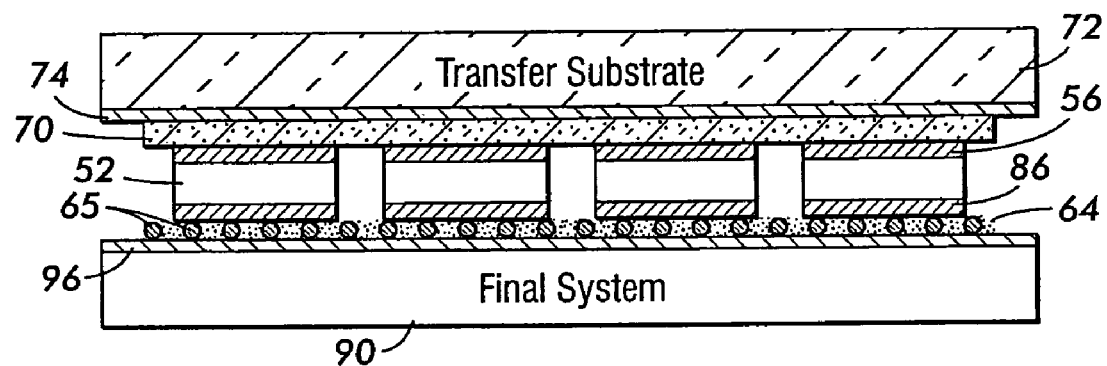
FIG. 9A illustrates bonding the thick film elements array to a final target system using thin, nonconductive epoxy bonding containing sub-µm conductive balls, where the thick film elements array is bonded to the transfer substrate using removable conductive epoxy bonding.

With more particular attention to FIG. 9A, to bond the thick film piezoelectric elements 52 to final target 90, nonconductive epoxy 64 containing sub-µm conductive balls 65 is interposed between a surface of the conductive layer 96 of the final target 90 and thick film elements 52. The opposite side surfaces of the thick film elements 52 are already temporarily bonded to the transfer substrate 72 (via conductor 74) through the use of a removable conductive tape 70.

Figure 9B:
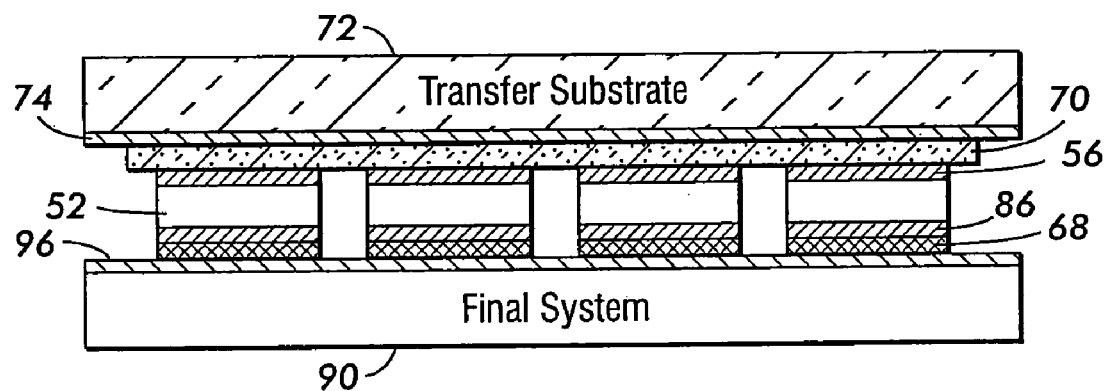
FIG. 9B is a bonding of the thick film elements array to the final target system using thin film intermetallic transient liquid phase bonding, where the thick film elements array is bonded to the transfer substrate using removable conductive epoxy bonding.

FIG. 9B illustrates an alternative bonding of the thick film elements 52 to final target system 90 using thin film intermetallic transient liquid phase bonding 68, where the thick film elements 52 are bonded to the transfer substrate 72 using removable conductive tape 70.

Figure 9C:
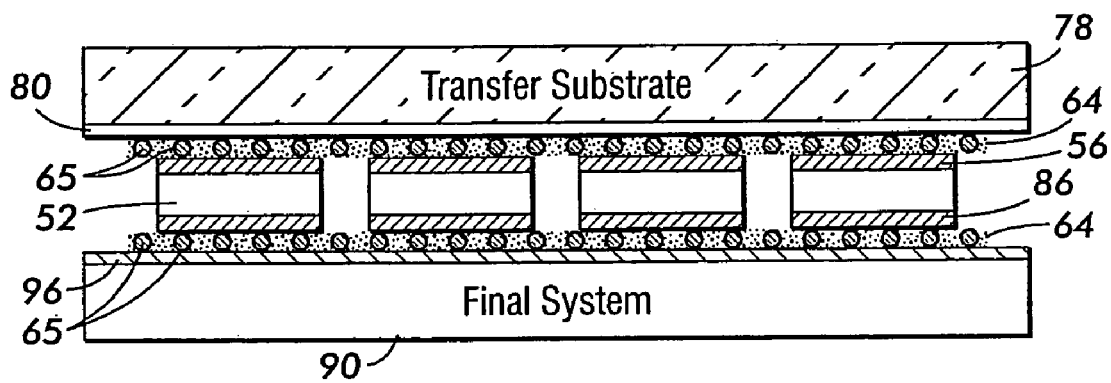
FIG. 9C is a bonding of the thick film elements array to the final target system using thin, nonconductive epoxy bonding containing sub-µm conductive balls, where the thick film elements array is bonded to an ITO-coated glass using the thin, nonconductive epoxy bonding containing sub-µm conductive balls.

The alternative bonding of FIG. 9C, shows the thick film elements 52 bonded to the final target system 90 using thin nonconductive epoxy bonding 64 containing sub-µm conductive balls 65. In this design, elements 52 are bonded to an ITO coated 80 glass substrate 78 using the thin nonconductive epoxy 64 containing sub-µm conductive balls 65.

Figure 9D:
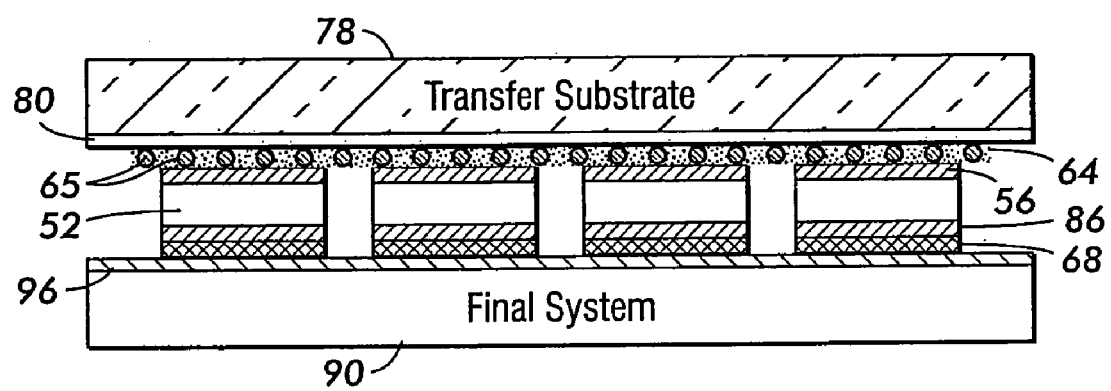
FIG. 9D depicts bonding the thick film elements array to the final target system using thin film intermetallic transient liquid phase bonding, where the thick film elements array is bonded to the ITO-coated glass using the thin, nonconductive epoxy bonding containing sub-µm conductive balls.

Depicted in FIG. 9D is an arrangement where the elements 52 are bonded to the final target system 90 (via conductor 96) using thin film intermetallic transient liquid phase bonding 68, where the thick film elements 52 are bonded to ITO coated 80 glass 78 using the thin nonconductive epoxy 64 containing sub-μm conductive balls 65.

Figure 10A:
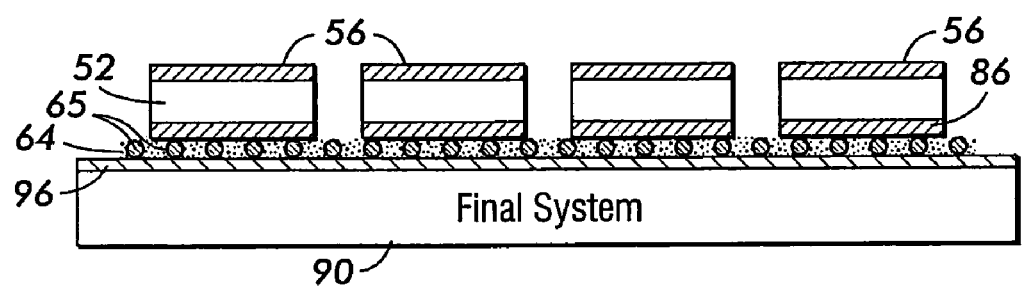
FIGS. 10A and 10B depict alternative embodiments of a final constructed system.
Figure 10B:
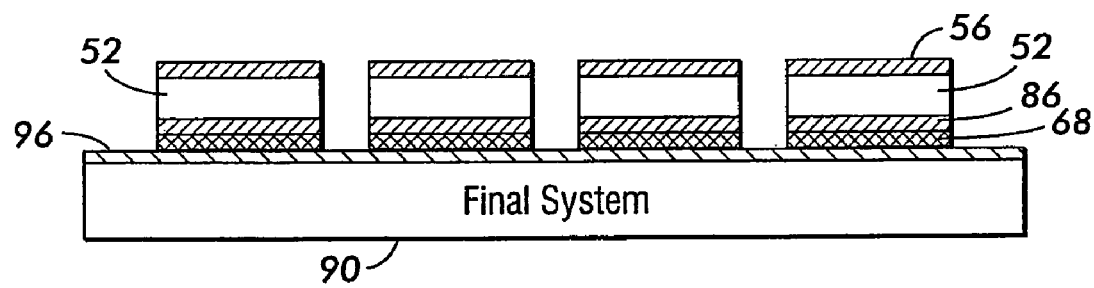

Once the final target has been bonded to the elements, the process proceeds to step 50 and the transfer substrates (such as 72 or 78) are removed, as shown in FIGS. 10A and 10B. For the case where the thick film elements are bonded to the transfer substrate using removable conductive epoxy, such as tape, after permanent bonding to the final target system is achieved, the tape and the transfer substrate can be easily peeled off from the thick film elements. The present process makes it easy to take off the conductive tape. This is because the conductive tape uses filled acrylic, such as the 3M 9712, 9713 and 9719 conductive tapes, which lose most of their adhesion after being heated at a temperature of between 150 and 200° C. The time needed for application of the heat will depend upon the specific application. In some applications this level of heat maybe applied during the process to bond the thick film elements 52 to the final target system or substrate.

For the case where the thick film elements 52 are bonded to the ITO coated glass using the thin nonconductive epoxy, the film elements can be released from the ITO coated glass by using a liftoff operation in a manner similar as in steps 20 or 40, where the radiation source is a laser. This is possible as the epoxy will also absorb the laser light, thus the laser exposure will burn off the epoxy and release the film from the glass substrate. As the melting point of epoxy is much lower than that of the metal and ITO electrodes, the laser exposure intensity maybe controlled so it will only burn off the epoxy and not cause any damage on the metal and ITO electrodes.

After removing the transfer carrier, solvent such as acetone or other appropriate substance may be used to clean off the residual of the conductive tape or the epoxy, and the process is completed.

It should be noted that when using laser liftoff techniques to release the piezoelectric thick film elements from ITO-coated glass, in one embodiment an excimer laser with relatively longer wavelength, such as Nd:YAG laser ($\lambda=355$ nm) and XeF ($\lambda=351$ nm) is to be used. This is because, as shown in FIG. 11, the transmission of light through ITO on glass will drop sharply around $\lambda=300$ nm, but around $\lambda=350$ nm the transmission can be about 80%. With such high transmission, the laser exposure can be controlled so that only the epoxy is destroyed and damage to the ITO and metal electrodes does not occur.

When the final target is a single piezoelectric ceramic thick film element—such as for single element high frequency transducers—it is desirable to put the single thick film elements on a rigid carrier using removable tape, which does not need to be conductive. In this situation, therefore, step 48 of FIG. 2 may be altered.

Particularly, where as in FIG. 12, removable conductive tape 70 has been used to bond the thick film elements 52 to the transfer substrate 70, the piezoelectric elements 52, and the transfer substrate 72 are heated to about 150 to 200° C. or other appropriate temperature causing the removable conductive tape 70 to lose most of its adhesion. Adhesion of the tape may be further reduced by putting the sample in a solvent such as acetone. Then the thick film elements are stuck to a rigid carrier 112 using removable tape 114. For the case where, as in FIG. 13, thin nonconductive epoxy 64 is used to bond the thick film elements 52 to an ITO 80 coated glass 78 as the transfer substrate, and the thick film elements are stuck to the rigid carrier 112 using removable tape 114.

In this case, the transfer substrate maybe removed by the previously discussed liftoff process.

After taking off the transfer substrate, solvents such as acetone may be used to clean off the residual of the conductive tape or the epoxy. Now the piezoelectric ceramic thick film elements are on a rigid carrier and are ready for use as shown in FIG. 14.

The proposed processes can be applied to make piezoelectric thick film arrays or individual piezoelectric elements for a variety of uses such as microfluid pumps including jet printers or acoustic ejectors, as well as for MEMS, high frequency transducers, catheters and other structures. Particular ones of these structures are now discussed.

With attention to microfluid pumps, it is known that current printheads commonly use bulk piezoelectric ceramics and make the actuator arrays by saw cutting. There are several drawbacks to this process: i) the performance of the actuation system (piezoelectric element+stainless steel diaphragm) cannot be optimized. With the thickness of the stainless steel diaphragm of 25 to 40 μm, the thickness of the piezoelectric elements should be about 40 to 70 μm for an optimized design. However, the thickness of the bulk piezoelectric elements is 100 μm or thicker as ceramic industry cannot now easily make bulk piezoelectric ceramics thinner than 100 μm; ii) only rectangular or square shapes can be realized by saw cutting, and this greatly limits the design feasibility; iii) cost is high, due to the time-consuming process and equipment cost of the saw cutting process, and very high requirements on bulk ceramics so that they can be cut into thin and small pieces. For example, for a printhead which needs 155×8 piezoelectric elements for one printhead, this means the manufacturing process needs to do 154+7=161 times of cutting for just one printhead; and iv) due to the saw cutting process, it is not possible to make high nozzle densities. It can be seen that using the method proposed in this application, the problems related to use of bulk piezoelectric ceramics and saw cutting process can be solved.

To use the proposed method to make piezoelectric thick film elements array for a microfluid pump, such as a printhead, either the transfer substrate process may be used or the thick film array may be permanently bonded to a metal foil such as copper foil. When the transfer substrate process is used, we will first transfer the piezoelectric thick film elements array from the carrier substrate to the transfer substrate, finish the piezoelectric film fabrication and property test, then bond the thick film elements to the printhead and release them from the transfer substrate. For this approach the current return path is the stainless steel diaphragm, which exists in current printhead configurations.

A printhead 120 as shown in FIG. 15 is formed on the stainless steel diaphragm 124, and the stainless steel is covered by an insulating layer 126, thus the top surface of piezoelectric thick film element (or actuators) 128 have to be connected as a current return path. To accomplish this, the piezoelectric thick film elements 128 are permanently bonded on a metal foil 130, such as copper, then released from the substrate (not shown) and the piezoelectric fabrication is finished. After testing, the piezoelectric elements are bonded to the printhead body 132, and thus the metal foil 130 will be on top of the piezoelectric thick film elements 128 and can be used as the current return path.

Another use to which the piezoelectric elements may be applied to is integrated hand-held sonar transducer arrays.

Figure 16:
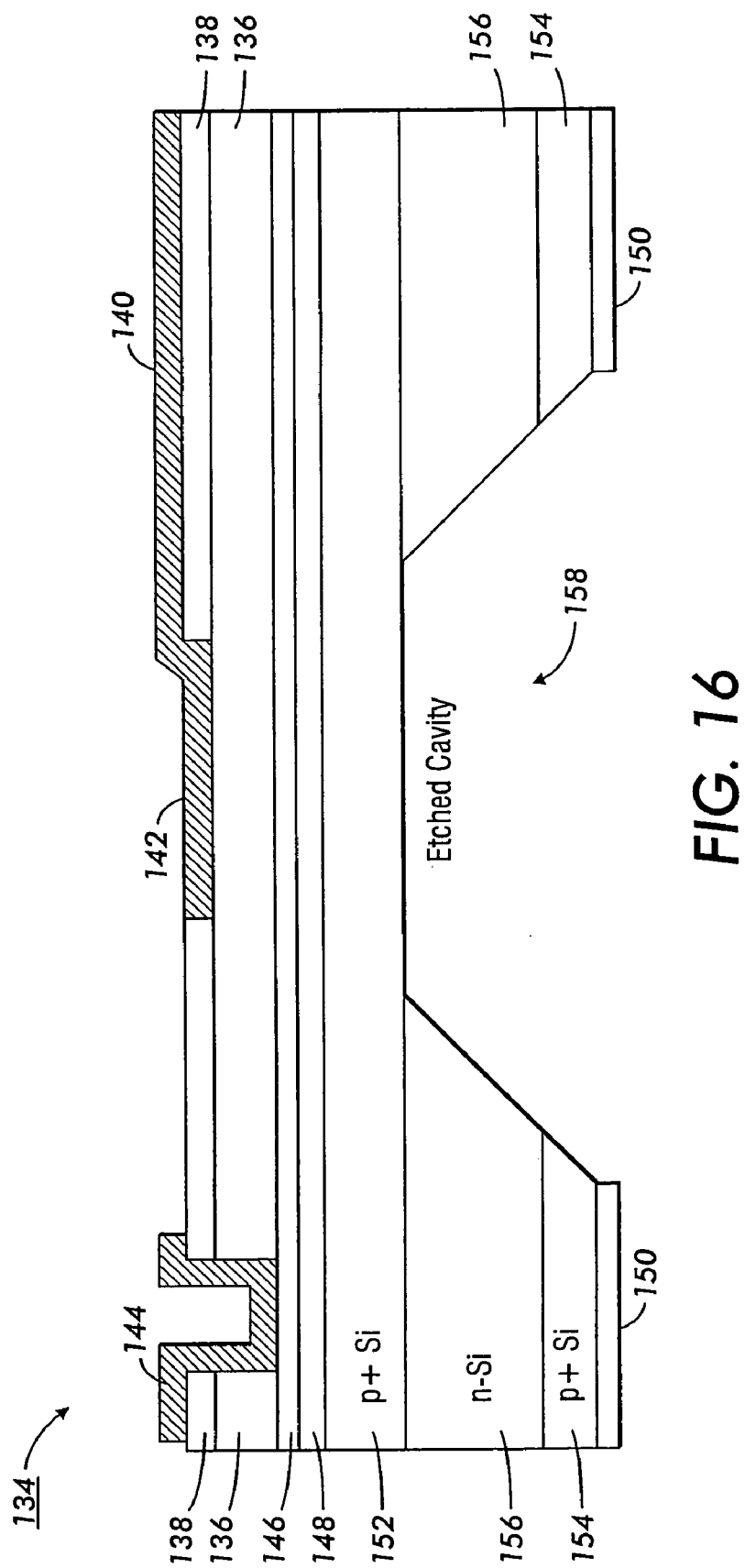
FIG. 16 depicts a hand-held sonar transducer array in which piezoelectric elements of the present application are implemented.

FIG. 16 is a side view of a micromachined transducer 134 which can be used as hand-held sonar, for ultrasound medical imaging and nondestructive testing, etc. Existing devices of this kind use 5 µm-thick sol-gel piezoelectric PZT films on a patterned silicon-based diaphragm to make bending mode transducers. However, to operate at higher frequencies, increase the voltage sensitivity or make the device work as both a transmitter and receiver, piezoelectric films with a thickness more than 10 µm are required, such as the piezoelectric thick film elements array disclosed in the present application.

The piezoelectric element 136 is sandwiched on top by a polyimide layer 138 which in turn carries a top Ti/Pt layer 140 and provides for a monomorph contact 142 and substrate contact 144. Sandwiching the piezoelectric element 136 on a bottom surface side is a bottom Ti/Pt layer 146, which separates the piezoelectric layer 136 from a $SiO_2$ layer 148. Transducer 134 is further configured with a bottom $SiO_2$ layer 150, and layers of P+ silicon 152, 154 are formed on each side of an n-type silicon 156. An etched cavity 158 completes the design configuration.

Figure 17:
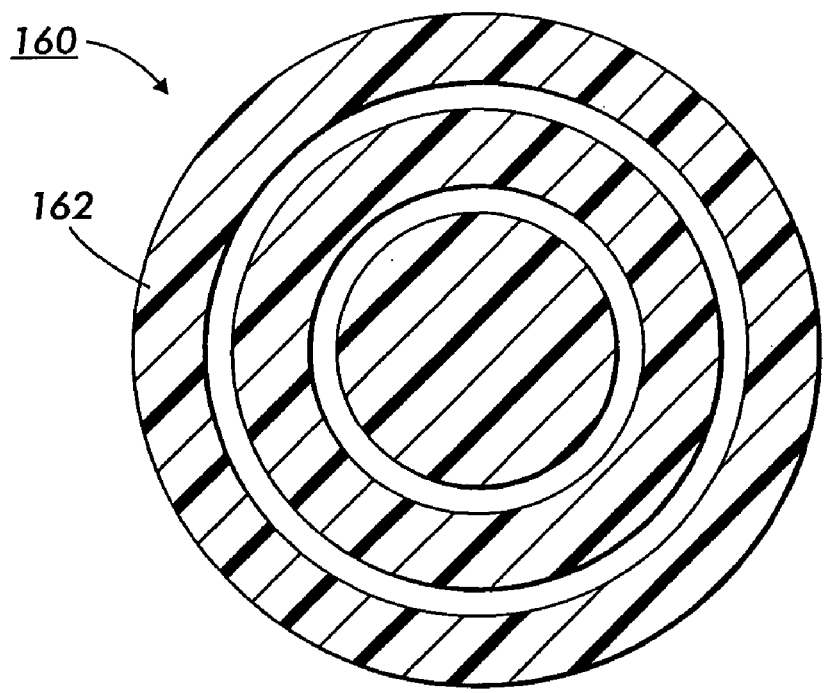
FIG. 17 depicts a configuration of an annular transducer array using the piezoelectric elements of the present application.
Figure 18:
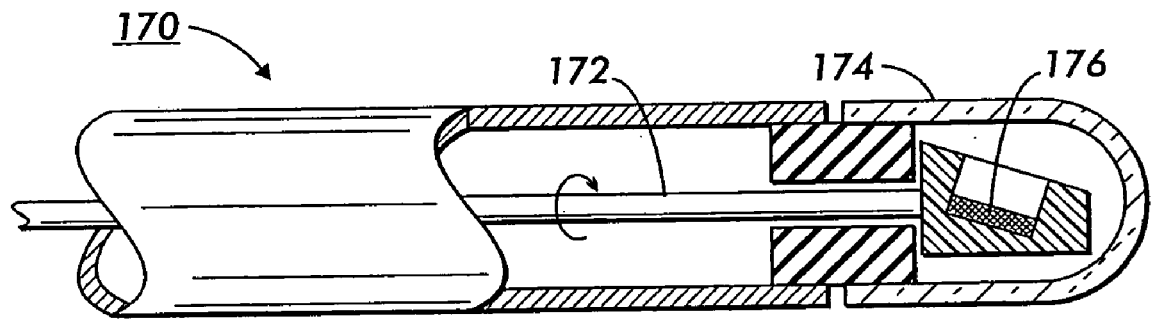
FIG. 18 sets forth a mechanical rotating single-element ultrasound catheter tip including the piezoelectric elements of the present application.

A further application to which the concepts of the present application may be used are arrays and single elements for high frequency transducers 160 (FIG. 17) and catheters 170 (FIG. 18). High frequency (e.g., 20 to 200 MHz) transducers and catheters are widely used in imaging skin, arterial walls, structures in the anterior chamber of the eye, and intravascular ultrasound imaging. To make these transducers, piezoelectric materials with thickness between greater than 10 and 100 µm are desirable, due to the resonant frequencies which may be obtained in this range. Table 1 gives the resonant frequency of piezoelectric films with various thickness (for longitudinal mode) in a range from greater than 10 to 100 µm.

TABLE 1

Resonant Frequency of piezoelectric Materials With Various Thicknesses

| | Piezoelectric thickness (µm) | | | | |
| --- | --- | --- | --- | --- | --- |
| | 100 | 50 | 40 | 20 | 10 |
| Resonant Frequency (MHz) | 20 | 40 | 50 | 100 | 200 |

As previously noted, it is difficult to make piezoelectric materials thinner than 100 µm, where the current method used in industry is to polish down the thickness of piezoelectric materials from more than 100 µm to the required thickness. This makes the piezoelectric element expensive. The polishing down bulk piezoelectric materials is also difficult to make some high frequency transducer arrays, such as the annular arrays 162 of (annular transducer 160) FIG. 17.

Clearly the method proposed in this application can easily make the piezoelectric thick film single elements and arrays for these applications, including the complicated arrays such as the annular array.

Mechanical rotating single-element catheters 170 may be constructed with a rotating shaft 172, a transparent dome 174 and a transducer element 176, among other known components. The transducer element is piezoelectric material preferably with a thickness of between 10–100 µm, and preferably 50 µm in order to obtain a working frequency of 40 MHz.

A further structure to which a piezoelectric elements array as described in the present application may be applied is to a microfluid ejector or pump, such as a jet printhead, acoustic ejector or other drop ejection mechanism as shown in FIGS. 19–21.

Existing commercialized piezoelectric ejectors will commonly use bulk piezoelectric ceramics as actuators and stainless steel for the ink cavity body and nozzle or control level plate. In one design, the ink cavity body and control or nozzle plate is made from many pieces or layers of stainless steel sheets which are blazed together under high temperature. An alternative type of ejector or printhead is developed using piezoelectric thin film actuators and silicon as the ink cavity body, made by silicon micromachining. The piezoelectric thin films can be made by sol-gel, sputtering, hydrothermal processing, among others.

However, drawbacks to these types of devices are their expense, or their inability to generate sufficient force to eject a droplet of a required size. For instance, in biofluid printing, it may be desired that the ejector system is disposed after each use, which would therefore call for an inexpensive drop ejection mechanism. Additionally, as the piezoelectric films in existing systems are very thin (less than 10 µm), the actuator in some applications such as solid-state ink printing and bioprinting, may not provide sufficient energy for proper droplet ejection. Up until now, there has not been a cost-effective method to combine piezoelectric thick films on stainless steel or silicon substrates.

A specific aspect of the present embodiment is to make piezoelectric thick films (i.e., between greater than 10 to 100 µm) as actuators, and to combine these thick film elements to a plastic ink cavity body and nozzle (e.g., for jet printheads) or liquid control plate (e.g., for acoustic ejection). Such a design provides an economic advantage over existing systems employing stainless steel stacks or silicon and simplifies the manufacturing process via the use of the plastic material.

Initially, the process of FIG. 2 is undertaken, whereby piezoelectric thick film actuators are manufactured. A generic view might be seen as FIGS. 10A and 10B, where in this embodiment the final system will be a plastic ink body cavity and nozzle or control plate design.

More particularly, as shown in FIG. 19, a plastic workpiece 180 is formed by injection molding, or other appropriate plastic manufacturing process, with ink cavities 182 in the body. As shown, the ink cavity in this embodiment has a dome or other curved shape so that the bottom part of ink cavity 182 has a thinner thickness than found at the side walls. This design allows the manufacture of a nozzle in the thinnest part of the ink cavity body, where the ink cavity wall becomes thicker when it is away from the nozzle area. This design is desirable when using the plastic design, as the plastic is softer than steel and silicon and avoids the forming of a thin nozzle plate.

Following the injection molding process, workpiece 180 is then further manufactured by forming nozzle holes 184 at the thinnest part of the plastic ink cavity body 182, as shown in FIG. 20. In one form of the process, the nozzle holes 184 are made by the use of laser cutting. However, other processes to make nozzle holes 184 may be employed. It is to be appreciated, that in alternative embodiments (e.g., when used for acoustic ejection), the workpiece 180 will not require nozzle holes 184. Rather, in some embodiments liquid control plates may be used. Thus, the system when used for acoustic ejection may have an open surface or liquid control plate. In FIG. 20 dotted lines 186 illustrate the formation of the workpiece 180 when used with acoustic ejection.

Following the formation of the workpiece 180, a next step includes bonding the plastic workpiece to a metal diaphragm with actuators, which may be accomplished via the steps described in connection with FIG. 2.

Illustrated in FIG. 21 is a basic ejection or printhead structure 188, configured according to the concepts of the present application. In this design, the piezoelectric thick film elements 190, which are preferably between greater than 10 to 100 µm are the actuators. In alternative embodiments, the actuators maybe 10 µm or less or greater than 100 µm. The actuators attached to metal diaphragm 192 are then connected, via the metal diaphragm, to the workpiece 180. Bonding layers 194, 196 may be formed by any of the previously described appropriate bonding techniques. Bonding layer 196 can also be a thick epoxy bonding process, as maintaining electric conductivity between the workpiece 180 and metal diaphragm 192 is not required. Electrical contacts 198 permit supplying of power to the printhead 188.

Plastic workpiece 180 is designed with an ink cavity body having a nozzle or liquid control plate arrangement. By this design, when in use with a printhead, plastic is used to make the ink cavity body and nozzle directly on the actuator arrangement, not requiring a separate nozzle or plate. The lateral dimension of the piezoelectric thick film actuators may be either the same or different between each other. The channel size may also be either the same or different between the other channels.

As previously noted, and with reference to FIG. 21, the plastic cavity body formed with the nozzle, may be made by injection molding and/or laser cutting. Also provided is a thin metal layer such as a stainless steel sheet which works as a passive diaphragm, and the piezoelectric films which work as the actuators. The thickness of the steel sheet may be from about 20 µm to 100 µm, and the piezoelectric film thickness could be from about greater than 10 to 100 µm. The shape of the piezoelectric film elements may be square, rectangular, circular or other forms.

Figure 22:
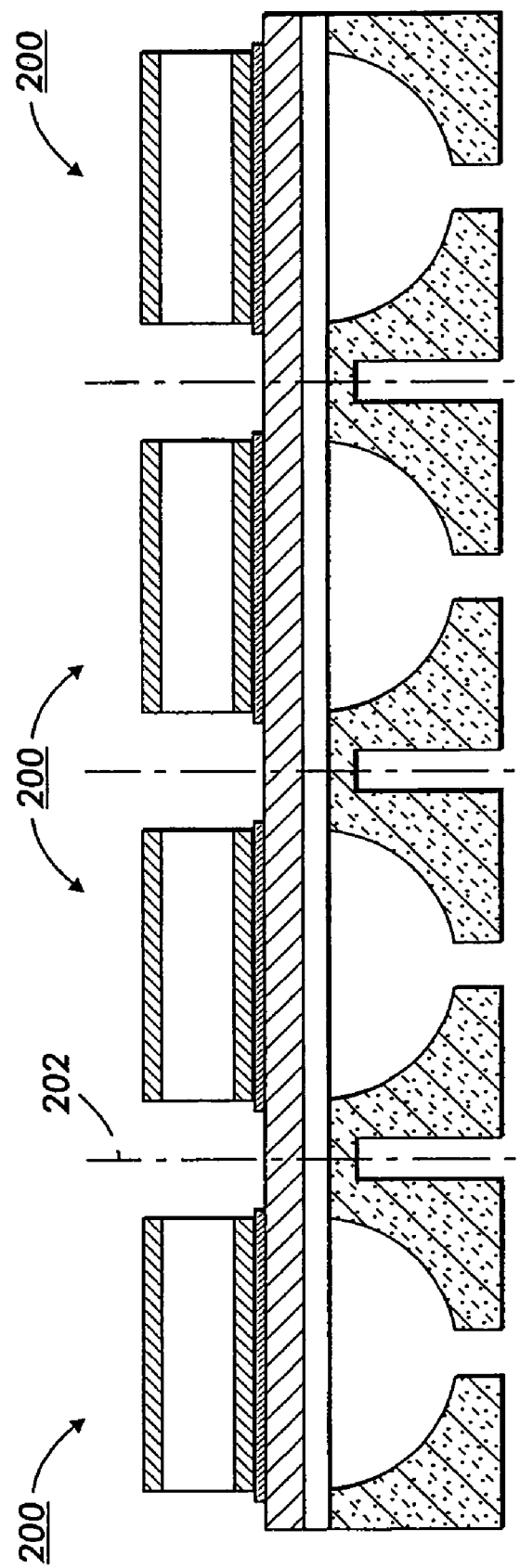
FIG. 22 illustrates single ejectors constructed in accordance with the present application.

In addition to the arrays of ejectors as shown in FIG. 21, it is to be appreciated that a single ejector 200 as shown in FIG. 22, may be designed as the final product. Each ejector 200 will be made in a similar manner as described, but with sufficient area so a cut line 202 may be used to obtain single ejector units.

It is to be appreciated, while one embodiment of the piezoelectric element array or single elements are shown in FIGS. 21 and 22, alternative elements or components may be used to generate the disclosed structures.

By the proposed disclosed processes, a fast efficient manner of making high volume, piezoelectric ceramic thick film arrays or single elements in a thickness range from greater than 10 to 100 µm is disclosed. It is to be appreciated that by use of an appropriate marking technique, such as screen printing, the range may be extended to as low as 5 µm or lower, and above 100 µm.

In this process, it is also known to be possible the elements may be patterned in any arbitrary geometric shape. Also, as only solid state powders are used as the raw materials, and the substrate is reusable, such as a sapphire substrate, economic advantages to the process over existing techniques are achieved.

It is also noted that by use of the proposed processes, a clean and low temperature technique for attachment to final target substrates or systems, irrespective of the material for the final target or substrate or system is achieved. For example, this process is fully compatible with IC processes, if the final system is to be a silicon based microelectronic device. It has been experimentally demonstrated by the inventors that bonding the piezoelectric films to a silicon wafer and performing the liftoff procedures does not damage a CMOS circuit on a silicon wafer.

Additionally, by the process of FIG. 2, the piezoelectric film fabrication process, including the poling step that causes the most damage in yield loss of piezoelectric films, are performed when the piezoelectric film is separated from the final target substrate or system. This further permits the piezoelectric thick film elements to be tested before being bonded to the final target substrate or system. Therefore, the proposed process will result in very low yield losses for the final target substrate or system.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A method of producing at least one thick-film element comprising:
    depositing a material onto a surface of at least one first substrate to form at least one thick-film element structure having a thickness of approximately greater than 10 µm to approximately 100 µm;
    bonding the at least one thick-film element structure to a second substrate;
    removing the at least one first substrate from the at least one thick-film element structure using a liftoff process using radiation energy including,
    emitting, from a radiation source, a radiation beam through the first substrate to an attachment interface formed between the first substrate and the at least one thick-film element structure at the surface of the first substrate, wherein the first substrate is substantially transparent at the wavelength of the radiation beam, permitting the radiation beam to generate sufficient energy at the interface to break the attachment.

2. The method according to claim 1, wherein the radiation beam is a laser beam.

3. The method according to claim 1, wherein the step of removing the first substrate further includes heating the interface with a heater to break any remaining attachment.

4. The method of claim 3, wherein the heater generates a temperature of between 40° C. to 50° C.

5. The method according to claim 1, wherein the first substrate is reusable.

6. The method according to claim 1, wherein a step of depositing an electrode on a surface of the at least one thick-film element structure, is undertaken following the step of depositing a material onto a surface of the first substrate to form the at least one thick-film element structure.

7. The method according to claim 1, wherein the bonding step includes a step of providing at least one of: (i) a nonconductive epoxy bonding containing conductive particles between the electrode and the second substrate, or (ii) a nonconductive epoxy bonding without conductive particles between the electrode and the second substrate, the second substrate being an electrically conductive substrate or having an electrically conductive portion, wherein the nonconductive epoxy bonding process provides for electrical contact between the electrode and the second substrate.

8. The method according to claim 1, wherein if more than one first substrate is used, the material on these substrates are the same.

9. The method according to claim 1, wherein the at least one thick-film element structure is a plurality of element structures, and if more than one substrate is used, the thickness and geometrical shape of the element structures on the substrates are the same.

10. The method according to claim 1, wherein the at least one thick-film element structure is a plurality of element structures, and if more than one substrate is used, the thickness and geometrical shape of the element structures on the substrates are different.

11. The method according to claim 1, wherein the depositing step includes patterning the at least one thick film element.

12. The method according to claim 1, wherein the depositing step implements a direct marking process.

13. The method according to claim 12, wherein the direct marking process is at least one of screen printing, ballistic aerosol marking, jet printing and acoustic ejection.

14. The method according to claim 1, wherein the depositing step includes sintering the at least one thick film element structure at a temperature of above 600° C.

15. The method according to claim 1, wherein the depositing step includes sintering the at least one thick film element structure at a temperature in a range of approximately 1100° C. to 1350° C.

16. The method according to claim 1, further including polishing a surface of the at least one thick film element structure.

17. The method according to claim 16, wherein the polishing step is a dry tape polishing procedure.

18. The method according to claim 1, wherein the wavelength of the radiation beam is approximately 308 nm.

19. The method of claim 1, wherein the material deposited onto the first substrate is a polycrystalline and it was deposited by a screen printing process.

20. The method of claim 1, wherein the emitting from the radiation source results in damage to a surface of the at least one thick-film element structure, the damage being no more than to a thickness of about 0.1 μm.

21. The method according to claim 1, wherein if more than one first substrate is used, the material on these substrates are different from each other.

* * * * *